(12) United States Patent  (10) Patent No.: US 8,722,192 B2
Paul  (45) Date of Patent: *May 13, 2014

(54) CIRCUIT MATERIALS WITH IMPROVED BOND, METHOD OF MANUFACTURE THEREOF, AND ARTICLES FORMED THEREFROM

(71) Applicant: World Properties, Inc, Lincolnwood, IL (US)

(72) Inventor: Sankar K. Paul, Branford, CT (US)

(73) Assignee: World Properties, Inc., Lincolnwood, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/649,333

(22) Filed: Oct. 11, 2012

(65) Prior Publication Data

US 2013/0034725 A1 Feb. 7, 2013

Related U.S. Application Data

(63) Continuation of application No. 11/829,406, filed on Jul. 27, 2007.

(60) Provisional application No. 60/821,710, filed on Aug. 8, 2006.

(51) Int. Cl.
  *B32B 27/08* (2006.01)
  *B32B 15/08* (2006.01)
(52) U.S. Cl.
  USPC .......................................... 428/413; 428/462
(58) Field of Classification Search
  USPC .................... 428/413, 462; 427/331
  See application file for complete search history.

(56) References Cited

U.S. PATENT DOCUMENTS

| | | | |
|---|---|---|---|
| 4,954,185 | A | 9/1990 | Kohm |
| 5,194,307 | A | 3/1993 | Gardeski |
| 5,310,820 | A | 5/1994 | Nelissen et al. |
| 5,416,143 | A | 5/1995 | El Sayed et al. |
| 5,541,243 | A | 7/1996 | Ohmura et al. |
| 5,569,545 | A | 10/1996 | Yokono et al. |
| 5,622,782 | A | 4/1997 | Poutasse, III et al. |
| 5,629,098 | A | 5/1997 | Poutasse et al. |
| 5,972,811 | A | 10/1999 | St. Lawrence et al. |
| 6,132,851 | A | 10/2000 | Poutasse |

(Continued)

FOREIGN PATENT DOCUMENTS

| | | | |
|---|---|---|---|
| EP | 0707038 A1 | | 4/1996 |
| JP | 61-009438 | * | 1/1986 |

(Continued)

OTHER PUBLICATIONS

Brist, et al., (Gary Brist, Stephen Hall, Sidney Clouser, and Tao Liang, "Non-classical conductor losses due to copper foil roughness and treatment", p. 26, Circuitree, May 2005), 11 pages.

(Continued)

*Primary Examiner* — Kevin R Kruer
(74) *Attorney, Agent, or Firm* — Cantor Colburn LLP

(57) ABSTRACT

A circuit material, comprising a conductive metal layer or a dielectric circuit substrate layer and an adhesive layer disposed on the conductive metal layer or the dielectric substrate layer, wherein the adhesive comprises a poly(arylene ether) and a polybutadiene or polyisoprene polymer.

34 Claims, 2 Drawing Sheets

(56) References Cited

U.S. PATENT DOCUMENTS

| | | | |
|---|---|---|---|
| 6,693,793 B2 * | 2/2004 | Kuwako et al. | 361/323 |
| 6,906,120 B1 * | 6/2005 | Davis et al. | 523/436 |
| 7,022,404 B2 | 4/2006 | Sethumadhavan et al. | |
| 7,090,920 B2 * | 8/2006 | Davis et al. | 428/413 |
| 7,413,791 B2 * | 8/2008 | Inoue et al. | 428/141 |
| 2001/0053450 A1 | 12/2001 | Yeager et al. | |
| 2005/0208278 A1 | 9/2005 | Landi et al. | |
| 2009/0151984 A1 | 6/2009 | Fujimura | |

FOREIGN PATENT DOCUMENTS

| | | | |
|---|---|---|---|
| JP | 62-149728 | * | 7/1987 |
| JP | 1987149728 A | | 7/1987 |
| JP | 62-235335 | * | 10/1987 |
| JP | 1987235335 A | | 10/1987 |
| JP | 1026555 A | | 1/1989 |
| JP | 1997031220 A | | 2/1997 |
| JP | 1999012456 A | | 1/1999 |
| JP | 1999209568 A | | 8/1999 |
| JP | 2005105061 A | | 4/2005 |
| JP | 2007126605 A | | 5/2007 |
| JP | 2007302877 A | | 11/2007 |
| WO | 02083328 A1 | | 10/2002 |
| WO | 2008020984 A2 | | 2/2008 |
| WO | 2008127970 A2 | | 10/2008 |
| WO | 2009126366 A2 | | 10/2009 |
| WO | 2010009381 A1 | | 1/2010 |

OTHER PUBLICATIONS

The International Searching Authority, Communication in Cases for Which No Other Form Is Applicable, PCT/US2010/038303, Date of Mailing: Feb. 16, 2011, 1 page.

JP2005105062 A; Publication date: Apr. 21, 2005, Abstract, 1 page.

Ogawa et al., (N. Ogawa, H. Onozeki, N. Moriike, T. Tanabe, T. Kumakura, "Profile-Free Copper Foil for High-Density Packaging Substrates and High-Frequency Applications", 2Proceedings of the 2005 Electronic Components and Technology Conference, IEEE, 5 pages.

The International Bureau, Preliminary Report on Patentability, PCT/US2009/034058, International Filing Date: Feb. 13, 2009, 8 pages.

The International Searching Authority, International Search Report, PCT/US2010/038303, Date of mailing: Nov. 23, 2010, 9 pages.

The International Searching Authority, International Search Report, PCT/US2010/038303, Date of Mailing Feb. 15, 2011, 7 pages.

The International Searching Authority, International Search Report, PCT/US2007/016987, Feb. 21, 2008, 5 pages.

International Searching Authority, International Search Report, PCT/US2009/034058, date of mailing Sep. 24, 2009, 7 pages.

International Searching Authority, Written Opinion, PCT/US2007/016987, 6 pages.

International Searching Authority, Written Opinion, PCT/US2009/034058, date of mailing Sep. 24, 2009, 7 pages.

The International Searching Authority, Written Opinion, PCT/US2010/038303, Date of Mailing Nov. 23, 2010, 10 pages.

JP2001127444 A, Publication date: May 11, 2001, Abstract, 1 page.
JP2001329147 A, Publication date: Nov. 27, 2001, Abstract, 1 page.
JP2001339131 A, Publication date: Dec. 7, 2001, Abstract, 1 page.
JP2004091533 A, Publication date: Mar. 25, 2004, Abstract, 1 page.
JP2005060489 A, Publication date: Mar. 10, 2005, Abstract, 1 page.
JP2005336426 A, Publication date: Dec. 8, 2005, Abstract, 1 page.
JP2006051687 A, Publication date: Feb. 23, 2006, Abstract, 1 page.
JP2006205694 A, Publication date: Aug. 10, 2006, Abstract, 1 page.
JP2007021763 A, Publication date: Feb. 1, 2007, Abstract, 1 page.
JP2008208778 A. Publication date: Sep. 11, 2008, Abstract, 1 page.
JP2009001728 A, Publication date: Jan. 8, 2009, Abstract, 1 page.
JP 09-001728 A, Date of Publication: Jan. 7, 1997, Abstract, 1 page.
JP 2003-283098, Date of publication: Oct. 3, 2003, Abstract, 1 page.
JP 2004-307761, Date of publication: Nov. 4, 2004, Abstract, 1 page.
JP 2005-248147, Date of publication: Sep. 15, 2005, Abstract, 1 page.

* cited by examiner

CIRCUIT MATERIALS WITH IMPROVED BOND, METHOD OF MANUFACTURE THEREOF, AND ARTICLES FORMED THEREFROM

CROSS REFERENCE TO RELATED APPLICATION

This application claims the benefits of U.S. Provisional Patent Application Ser. No. 60/821,710 filed Aug. 8, 2006 and U.S. Non-Provisional patent application Ser. No. 11/829,406 filed Jul. 27, 2007, which applications are fully incorporated herein by reference.

BACKGROUND

This invention generally relates to circuit materials, methods of manufacture of the circuit materials, and articles formed therefrom.

As used herein, a circuit material is an article used in the manufacture of circuits and multi-layer circuits, and includes circuit laminates, bond plies, resin coated conductive layers, and cover films. A circuit laminate is a type of circuit material that has a conductive layer, e.g., copper, fixedly attached to a dielectric substrate layer. Double clad circuit laminates have two conductive layers, one on each side of the dielectric substrate layer. Patterning a conductive layer of a laminate, for example by etching, provides a circuit. Multilayer circuits comprise a plurality of conductive layers, at least one of which contains a conductive wiring pattern. Typically, multilayer circuits are formed by laminating one or more circuits together using bond plies and, in some cases, resin coated conductive layers, in proper alignment using heat and/or pressure. After lamination to form the multilayer circuit, known hole-forming and plating technologies can be used to produce useful electrical pathways between conductive layers.

Historically, circuit substrates have been made with glass fabric-reinforced epoxy resins. The relatively polar epoxy material bonds comparatively well to metallic surfaces such as copper foil. However, the polar groups in the epoxy resin also lead to a relatively high dielectric constant and high dissipation factor. Electronic devices that operate at higher frequencies require use of circuit substrates with low dielectric constants and low dissipation factors. Better electrical performance is achieved by using comparatively nonpolar resin systems, such as those based on polybutadiene, polyisoprene, or polyphenylene oxide polymer systems. An unwanted consequence of the lower polarity of these resins systems is an inherently lower bond to metallic surfaces.

In addition, as electronic devices and the features thereon become smaller, manufacture of dense circuit layouts is facilitated by use of substrates with a high glass transition temperature. However, when dielectric substrates with low dielectric constants, low dissipation factors, and high glass transition temperatures are used, adhesion between the conductive layer and the dielectric substrate layer can be reduced. Adhesion can be even more severely reduced when the conductive layer is a low or very low roughness copper foil (low profile copper foil). Such foils are desirably used in dense circuit designs to improve the etch definition and in high frequency applications to lower the conductor loss due to roughness.

A number of efforts have been made to improve the bonding between dielectric circuit substrates and the conductive layer surface. For example, use of various specific polymeric compositions has been disclosed. PCT Application No. 99/57949 to Holman discloses using an epoxy or phenoxy resin having a molecular weight greater than about 4,500 to improve the peel strength of a circuit laminate. U.S. Pat. No. 6,132,851 to Poutasse also discloses use of a phenolic resole resin/epoxy resin composition-coated metal foil as a means to improve adhesion to circuit substrates. U.S. Pat. No. 4,954,185 to Kohm describes a two-step process for producing a coated metal foil for printed circuit board laminates, the first being a chemical process to create a metal oxide layer on the metal substrate surface, and the second being the application of a poly(vinyl acetal)/thermosetting phenolic composition. Gardeski, in U.S. Pat. No. 5,194,307, describes an adhesive composition having one or more epoxy components and a high molecular weight polyester component. The cured adhesive layer is flexible and can be used for bonding metal foil to flexible circuit substrate (e.g., polyimide film). Yokono et al. describe improved adhesion in a copper clad circuit laminate in U.S. Pat. No. 5,569,545, obtained by use of various sulfur-containing compounds that presumably crosslink with the resin and chemically bond to the copper. The presence of sulfur-containing compounds can be undesirable, giving rise to an increased tendency to corrode. U.S. Patent Publication No. 2005/0208278 to Landi et al. discloses the use of an adhesion-promoting elastomeric layer comprising a non-sulfur curing agent. However, in practice it has been found that the elastomeric adhesion promoting layers can result in a soft surface, increasing the possibility of handling damage during processing. Finally, Poutasse and Kovacs, in U.S. Pat. No. 5,622,782, use a multi-component organosilane layer to improve foil adhesion with another substrate. Copper foil manufacturers can apply a silane treatment to their foils as the final production step, and the silane composition, which is often proprietary, is commonly selected to be compatible with the substrate of the customer.

As noted by Poutasse et al. in U.S. Pat. No. 5,629,098, adhesives that provide good adhesion to metal and substrate (as measured by peel strength) generally have less than satisfactory high temperature stability (as measured in a solder blister resistance test). Conversely, adhesives that provide good high temperature stability generally have less than satisfactory adhesion. There accordingly remains a need in the art for methods for improving the bond between a conductive metal and a circuit substrate, particularly thin, rigid, thermosetting substrates having low dielectric constants, dissipation factors, and high glass transition temperatures, that maintains adhesiveness at high temperatures. It would be advantageous if the adhesive did not require B-staging, and/or that use of the adhesive did not adversely affect the electrical and mechanical properties of the resulting circuit materials.

SUMMARY OF INVENTION

In one embodiment, an adhesive useful for forming a circuit laminate comprises a poly(arylene ether), preferably a carboxy-functionalized poly(arylene ether), and a co-curable polybutadiene or polyisoprene polymer, preferably a carboxy-functionalized polybutadiene or polyisoprene polymer. In another embodiment, the adhesive further comprises an elastomeric block copolymer comprising units derived from an alkenyl aromatic compound and a conjugated diene.

In another embodiment, a circuit material for forming a circuit laminate comprises a conductive layer or a dielectric circuit substrate; and an adhesive layer disposed on at least a portion of a surface of the conductive layer or the dielectric circuit substrate, wherein the adhesive layer comprises a poly(arylene ether), preferably a carboxy-functionalized poly(arylene ether), and a co-curable polybutadiene or polyisoprene polymer, preferably a carboxy-functionalized polybutadiene or polyisoprene polymer. In still another embodiment, the adhesive layer further comprises an elastomeric block copolymer comprising units derived from an alkenyl aromatic compound and a conjugated diene. The cured dielectric circuit substrate and the cured adhesive layer can have a dielectric constant of less than about 3.8 and a dissipation factor of less than about 0.007, each measured at 10 gigahertz.

In another embodiment, a circuit laminate comprises one of the above-described adhesive layers disposed between a conductive layer and a circuit substrate. In still another embodiment, the adhesive layer consists essentially of a poly(arylene ether) or a carboxy-functional poly(arylene ether).

A method of forming a low dielectric constant, low dissipation factor circuit laminate comprises disposing one of the above-described adhesive layers between a conductive layer and a circuit substrate, and laminating the layers.

In yet another embodiment, a circuit comprises the above-described circuit materials and/or laminates.

In still another embodiment, a multi-layer circuit comprises the above-described circuit materials and/or circuit laminates.

The invention is further illustrated by the following drawings, detailed description, and examples.

BRIEF DESCRIPTION OF DRAWINGS

Referring now to the exemplary drawings wherein like elements are numbered alike in the several figures.

DETAILED DESCRIPTION

Figure 1:
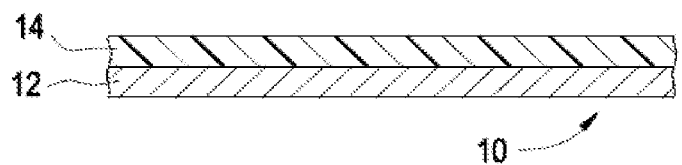
FIG. 1 shows an exemplary circuit material with an adhesive layer disposed on a conductive layer, e.g., a copper foil.

It has unexpectedly been discovered by the inventors hereof that relatively nonpolar resins can be used to improve the adhesion between a conductive metal and a relatively nonpolar dielectric substrate material. Accordingly, described herein are bond improvement adhesive compositions comprising a poly(arylene ether); optionally, a polybutadiene or polyisoprene polymer, preferably a carboxylated polybutadiene or polyisoprene polymer; and optionally, an elastomeric block copolymer comprising units derived from an alkenyl aromatic compound and a conjugated diene. The poly(arylene ether) can also optionally be carboxy-functionalized. The combination of these components provides enhanced adhesion between a conductive metal layer and a circuit substrate, as well as improved flame resistance. The improved bond strength is advantageously maintained at high temperatures, such as those encountered during soldering operations (e.g., 550° F. or 288° C.). In a particularly advantageous feature, use of the adhesive composition does not significantly adversely affect the electrical properties of the resultant circuit laminate, such as low dielectric constant, low dissipation factor, low water absorption, and improved dielectric breakdown strength.

The poly(arylene ether) can be in the form of a homopolymer or a copolymer, including a graft or a block copolymer. Combinations of various forms can be used. Poly(arylene ether)s comprise a plurality of structural units of formula (1):

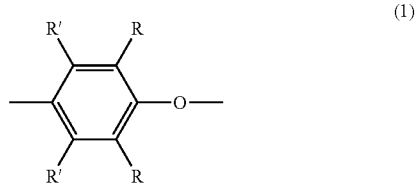

wherein for each structural unit, each R and R' is independently hydrogen, halogen, primary or secondary $C_{1-7}$ alkyl, phenyl, $C_{1-7}$ aminoalkyl, $C_{1-7}$ alkenylalkyl, $C_{1-7}$ alkynylalkyl, $C_{1-7}$ alkoxy, $C_{6-10}$ aryl, and $C_{6-10}$ aryloxy. In some embodiments, each R is independently $C_{1-7}$ alkyl or phenyl, for example, $C_{1-4}$ alkyl, and each R' is independently hydrogen or methyl.

Exemplary poly(arylene ether)s include poly(2,6-dimethyl-1,4-phenylene ether), poly(2,6-diethyl-1,4-phenylene ether), poly(2,6-dipropyl-1,4-phenylene ether), poly(2-methyl-6-allyl-1,4-phenylene ether), poly(di-tert-butyl-dimethoxy-1,4-phenylene ether), poly(2,6-dichloromethyl-1,4-phenylene ether, poly(2,6-dibromomethyl-1,4-phenylene ether), poly(2,6-di(2-chloroethyl)-1,4-phenylene ether), poly(2,6-ditolyl-1,4-phenylene ether), poly(2,6-dichloro-1,4-phenylene ether), poly(2,6-diphenyl-1,4-phenylene ether), and poly(2,5-dimethyl-1,4-phenylene ether). A useful poly(arylene ether) comprises 2,6-dimethyl-1,4-phenylene ether units, optionally in combination with 2,3,6-trimethyl-1,4-phenylene ether units.

The poly(arylene ether) can be functionalized so as to provide a functional group that enhances adhesion between a conductive metal layer and a circuit substrate layer. Functionalization can be accomplished using a polyfunctional compound having in the molecule both (i) a carbon-carbon double bond or a carbon-carbon triple bond, and (ii) one or more of a carboxy group, including a carboxylic acid, anhydride, amide, ester, or acid halide. In one embodiment the functional group is a carboxylic acid or ester group. Examples of polyfunctional compounds that can provide a carboxylic acid functional group include maleic acid, maleic anhydride, fumaric acid, and citric acid.

In particular, suitable functionalized poly(arylene ether)s include the reaction product of a poly(arylene ether) and a cyclic carboxylic acid anhydride. Examples of suitable cyclic anhydrides are maleic anhydride, succinic anhydride, glutaric anhydride, adipic anhydride, and phthalic anhydride, more specifically, maleic anhydride. Modified poly(arylene ethers) such as maleinized poly(arylene ethers) can be produced by methods as described in U.S. Pat. No. 5,310,820, or are commercially available. Examples of commercially available suitable modified and unmodified poly(arylene ethers) include PPE-MA from Asahi (a maleinized poly(arylene ether)), OPE-Sty from Mitui Gas Chemicals (a styrene terminated poly(arylene ether)), and Blendex HPP820 from Chemtura (an unmodified poly(arylene ether)).

In some embodiments, the adhesives further comprise a polybutadiene or polyisoprene polymer. A "polybutadiene or polyisoprene polymer" as used herein includes homopolymers derived from butadiene, homopolymers derived from isoprene, and copolymers derived from butadiene and/or isoprene and/or less than 50 weight percent (wt %) of a monomer co-curable with the butadiene and/or isoprene. Suitable monomers co-curable with butadiene and/or isoprene include monoethylenically unsaturated compounds such as acrylonitrile, ethacrylonitrile, methacrylonitrile, alpha-chloroacrylonitrile, beta-chloroacrylonitrile, alpha-bromoacrylonitrile, $C_{1-6}$ alkyl(meth)acrylates (for example, methyl(meth)acrylate, ethyl(meth)acrylate, n-butyl(meth)acrylate, n-propyl (meth)acrylate, and isopropyl(meth)acrylate), acrylamide, methacrylamide, maleimide, N-methyl maleimide, N-ethyl maleimide, itaconic acid, (meth)acrylic acid, alkenyl aromatic compounds as described below, and combinations comprising at least one of the foregoing monoethylenically unsaturated monomers.

The co-curable polybutadiene or polyisoprene polymer used in the adhesive composition can be co-curable with the poly(arylene ether). In one embodiment, the polybutadiene or polyisoprene polymer is carboxy-functionalized. Functionalization can be accomplished using a polyfunctional compound having in the molecule both (i) a carbon-carbon double bond or a carbon-carbon triple bond, and (ii) one or more of a carboxy group, including a carboxylic acid, anhydride, amide, ester, or acid halide. A preferred carboxy group is a carboxylic acid or ester. Examples of polyfunctional compounds that can provide a carboxylic acid functional group include maleic acid, maleic anhydride, fumaric acid, and citric acid. In particular, polybutadienes adducted with maleic anhydride can be used in the adhesive composition. Suitable maleinized polybutadiene polymers are commercially available, for example from Sartomer under the trade names RICON 130MA8, RICON 130MA13, RICON 130MA20, RICON 131MA5, RICON 131MA10, RICON 131MA17, RICON 131MA20, and RICON 156MA17. Suitable maleinized polybutadiene-styrene copolymers are commercially available, for example, from Sartomer under the trade names RICON 184MA6. RICON 184MA6 is a butadiene-styrene copolymer adducted with maleic anhydride having styrene content from 17 to 27 wt % and number average molecular weight (Mn) of about 9,900 g/mole.

In still other embodiments, the adhesives further comprise an elastomeric polymer. The elastomeric polymer can be co-curable with the poly(arylene ether) and/or the polybutadiene or isoprene resin. Suitable elastomers include elastomeric block copolymers comprising a block (A) derived from an alkenyl aromatic compound and a block (B) derived from a conjugated diene. The arrangement of blocks (A) and (B) includes linear and graft structures, including radial teleblock structures having branched chains. Examples of linear structures include diblock (A-B), triblock (A-B-A or B-A-B), tetrablock (A-B-A-B), and pentablock (A-B-A-B-A or B-A-B-A-B) structures as well as linear structures containing 6 or more blocks in total of A and B. Specific block copolymers include diblock, triblock, and tetrablock structures, and specifically the A-B diblock and A-B-A triblock structures.

The alkenyl aromatic compound providing the block (A) is represented by formula (2):

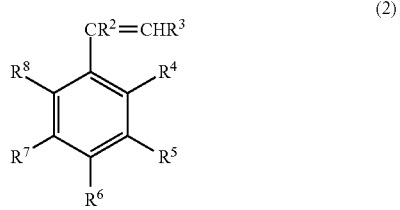

(2)

wherein each of $R^2$ and $R^3$ is independently hydrogen, $C_1$-$C_5$ alkyl, bromo, or chloro, and each of $R^4$, $R^5$, $R^6$, $R^7$, and $R^8$ is independently hydrogen, $C_1$-$C_{12}$ alkyl, $C_3$-$C_{12}$ cycloalkyl, $C_6$-$C_{12}$ aryl, $C_7$-$C_{12}$ aralkyl, $C_7$-$C_{12}$ alkaryl, $C_1$-$C_{12}$ alkoxy, $C_3$-$C_{12}$ cycloalkoxy, $C_6$-$C_{12}$ aryloxy, chloro, bromo, or hydroxy. Exemplary alkenyl aromatic compounds include styrene, 3-methylstyrene, 4-methylstyrene, 3,5-diethylstyrene, 4-n-propylstyrene, alpha-methylstyrene, alpha-methyl vinyltoluene, alpha-chlorostyrene, alpha-bromostyrene, dichlorostyrene, dibromostyrene, tetra-chlorostyrene, and the like, and combinations comprising at least one of the foregoing compounds. Styrene and/or alpha-methylstyrene are often used.

Specific examples of the conjugated dienes used to provide block (B) include 1,3-butadiene, 2-methyl-1,3-butadiene (isoprene), 2,3-dimethyl-1,3-butadiene, and 1,3-pentadiene, specifically 1,3-butadiene and isoprene. A combination of conjugated dienes can be used. The block (B) derived from a conjugated diene is optionally partially or fully hydrogenated.

Exemplary block copolymers comprising a block (A) derived from an alkenyl aromatic compound and block (B) derived from a conjugated diene include styrene-butadiene diblock copolymer (SB), styrene-butadiene-styrene triblock copolymer (SBS), styrene-isoprene diblock copolymer (SI), styrene-isoprene-styrene triblock copolymer (SIS), styrene-(ethylene-butylene)-styrene triblock copolymer (SEBS), styrene-(ethylene-propylene)-styrene triblock copolymer (SEPS), and styrene-(ethylene-butylene) diblock copolymer (SEB). Such polymers are commercially available, for example from Shell Chemical Corporation under the trade names KRATON D-1101, KRATON D-1102, KRATON D-1107, KRATON D-1111, KRATON D-1116, KRATON D-1117, KRATON D-1118, KRATON D-1119, KRATON D-1122, KRATON D-1135X, KRATON D-1184, KRATON D-1144X, KRATON D-1300X, KRATON D-4141, KRATON D-4158, KRATON G1726, and KRATON G-1652. KRATON D-1118 is a solid SB-SBS copolymer. This copolymer has polystyrene end blocks and a rubbery polybutadiene mid-block with about 20% SBS triblock and about 80% SB diblock. It is a low modulus, low cohesive strength, soft rubber.

The relative amount of the poly(arylene ether)s, the polybutadiene or polyisoprene polymer, and the elastomeric block copolymer will depend on the particular substrate material used, the desired properties of the circuit materials and circuit laminates, and like considerations. It has been found that use of a poly(arylene ether) provides increased bond strength between a conductive metal layer, particularly copper, and a relatively nonpolar dielectric substrate material. This result is particularly surprising since poly(arylene ether)s are themselves nonpolar. Use of a polybutadiene or polyisoprene polymer further increases high temperature resistance of the laminates, particularly when these polymers are carboxy-functionalized. Use of an elastomeric block copolymer may function to compatibilize the components of the adhesive. Determination of the appropriate quantities of each component can be done without undue experimentation, using the guidance provided herein.

In one embodiment, the adhesive composition comprises up to 100 wt % of the poly(arylene)ether, specifically the carboxy-functionalized poly(arylene ether). In another embodiment, the adhesive composition consists essentially of up to 100 wt % of the poly(arylene)ether, specifically the carboxy-functionalized poly(arylene)ether. In still another embodiment, the adhesive composition consists of up to 100 wt % of the poly(arylene)ether, specifically the carboxy-functionalized poly(arylene)ether.

The adhesive composition can alternatively comprise about 20 to about 99 wt %, specifically about 30 to about 80 wt %, more specifically about 40 to about 60 wt % of the poly(arylene ether), preferably the carboxy-functionalized poly(arylene ether), and about 1 to about 80 wt %, specifically about 20 to about 70 wt %, more specifically about 40 to about 60 wt % of the polybutadiene or polyisoprene polymer, preferably the carboxy-functionalized polybutadiene or polyisoprene polymer, each of the foregoing amounts being based on the total weight of the polymer portion of the adhesive composition.

In still another embodiment, the adhesive composition comprises about 20 to about 98 wt %, specifically about 25 to about 75 wt %, more specifically about 30 to about 50 wt % of the poly(arylene ether), preferably the carboxy-functionalized poly(arylene ether); about 1 to about 79 wt %, specifically about 10 to about 60 wt %, more specifically about 20 to about 40 wt % of the co-curable polybutadiene or polyisoprene polymer, preferably the co-curable carboxy-functionalized polybutadiene or polyisoprene polymer; and about 1 to about 79 wt %, specifically about 10 to about 60 wt %, more specifically about 20 to about 40 wt % of the elastomeric block copolymer, each based on the total weight of the polymer portion of the adhesive composition.

In addition to the one or more of the polymers described above, the adhesive composition can further optionally comprise additives such as cure initiators, crosslinking agents, viscosity modifiers, coupling agents, wetting agents, flame retardants, fillers, and antioxidants. The particular choice of additives depends upon the nature of the conductive layer and the circuit substrate composition and are selected so as to enhance or not substantially adversely affect adhesion between a conductive layer and a circuit substrate, dielectric constant, dissipation factor, water absorbance, flame retardance, and/or other desired properties of the circuit material.

Suitable fillers for use in the adhesive composition include titanium dioxide (rutile and anatase), barium titanate, strontium titanate, silica, including fused amorphous silica, corundum, wollastonite, aramide fibers (e.g., KEVLAR™ from DuPont), fiberglass, $Ba_2Ti_9O_{20}$, glass spheres, quartz, boron nitride, aluminum nitride, silicon carbide, beryllia, alumina, magnesia, magnesium hydroxide, mica, talcs, nanoclays, aluminosilicates (natural and synthetic), and fumed silicon dioxide (e.g., Cab-O-Sil, available from Cabot Corporation), used alone or in combination. The fillers can be in the form of solid, porous, or hollow particles. Specific fillers include rutile titanium dioxide and amorphous silica. To improve adhesion between the fillers and polymer, the filler can be treated with one or more coupling agents, such as silanes, zirconates, or titanates. Fillers, when used, are typically present in an amount of about 0.05 to about 10 wt %, specifically about 0.1 to about 8 wt %, based on the total weight of the adhesive composition.

Suitable cure initiators include those useful in initiating cure (cross-linking) of the polymers, in the adhesive composition. Examples include, but are not limited to, azides, peroxides, sulfur, and sulfur derivatives. Free radical initiators are especially desirable as cure initiators. Examples of free radical initiators include peroxides, hydroperoxides, and non-peroxide initiators such as 2,3-dimethyl-2,3-diphenyl butane. Examples of peroxide curing agents include dicumyl peroxide, alpha, alpha-di(t-butylperoxy)-m,p-diisopropylbenzene, 2,5-dimethyl-2,5-di(t-butylperoxy)hexane-3, and 2,5-dimethyl-2,5-di(t-butylperoxy)hexyne-3, and mixtures comprising one or more of the foregoing cure initiators. The cure initiator, when used, is typically present in an amount of about 0.25 wt % to about 15 wt %, based on the total weight of the adhesive composition.

Crosslinking agents are reactive monomers or polymers that increase the cross-link density upon cure of the adhesive. In one embodiment, such reactive monomers or polymers are capable of co-reacting with a polymer in the adhesive polymer and a polymer in the circuit substrate composition. Examples of suitable reactive monomers include styrene, divinyl benzene, vinyl toluene, divinyl benzene, triallylcyanurate, diallylphthalate, and multifunctional acrylate monomers (such as Sartomer compounds available from Sartomer Co.), among others, all of which are commercially available. Useful amounts of crosslinking agents are about 0.1 to about 50 wt %, based on the total weight of the adhesive composition.

Suitable antioxidants include radical scavengers and metal deactivators. A non-limiting example of a free radical scavenger is poly[[6-(1,1,3,3-tetramethylbutyl)amino-s-triazine-2,4-dyil]][(2,2,6,6,-tetramethyl-4-piperidyl)imino]hexamethylene[(2,2,6,6-tetramethyl-4-piperidyl)imino]], commercially available from Ciba Chemicals under the tradename Chimmasorb 944. A non-limiting example of a metal deactivator is 2,2-oxalyldiamido bis[ethyl 3-(3,5-di-t-butyl-4-hydroxyphenyl)propionate] commercially available from Uniroyal Chemical (Middlebury, Conn.) under the tradename Naugard XL-1. A single antioxidant or a mixture of two or more antioxidants can be used. Antioxidants are typically present in amounts of up to about 3 wt %, specifically about 0.5 to about 2.0 wt %, based on the total weight of the adhesive composition.

Coupling agents can be present to promote the formation of or participate in covalent bonds connecting a metal surface or filler surface with a polymer. Exemplary coupling agents include 3-mercaptopropylmethyldimethoxy silane and 3-mercaptopropyltrimethoxy silane. Coupling agents, when present, can be present in amounts of about 0.1 to about 1 wt %, based on the total weight of the adhesive composition.

The above-described adhesive composition can be used with a dielectric circuit substrate and a conductive layer to make circuit materials, circuit laminates, circuits, and multilayer circuits. Suitable conductive layers include a thin layer of a conductive metal such as a copper foil presently used in the formation of circuits, for example, electrodeposited copper foils. Useful copper foils typically have thicknesses of about 9 to about 180 micrometers.

The copper foil can be made either by the electrodeposition (ED) on a rotating stainless steel drum from a copper sulfate bath, or by the rolling of solid copper bars. Where ED copper foil is used, the initial roughness of the base foil is created in the foil plating process on the "bath side" (or matte side) of the foil. Additional roughness is created in a secondary plating step. Where rolled foil used, roughness is imparted to the initially smooth and shiny foil by a secondary plating step.

This mechanical roughness can result in several drawbacks. As described in detail by Brist et al. (Gary Brist, Stephen Hall, Sidney Clouser, and Tao Liang, "Non-classical conductor losses due to copper foil roughness and treatment," p. 26, *Circuitree*, May 2005) and Ogawa et al. (N. Ogawa, H. Onozeki, N. Moriike, T. Tanabe, T. Kumakura, "Profile-free foil for high-density packaging substrates and high-frequency applications," p. 457, Proceedings of the 2005 Electronic Components and Technology Conference, IEEE), the roughness on a conductor surface can result in a substantial increase in conductor loss at high frequencies, with a rough conductor causing up to twice the conductor loss of a smooth one. Ogawa also describes the limitations to accurate circuit fabrication, most notably the accurate etching of fine lines and spaces that are caused by conductor roughness.

The roughness of a copper foil is generally characterized by contact profilometry or optical interferometry. Most foil manufacturers measure roughness with a contact profilometer, due to their long history with such a measurement system. Most of the values cited herein were measured using a Veeco Instruments WYCO Optical Profiler, using the method of white light interferometry. Since the roughness may exist on several different scales and will consist of many peaks and valleys with varying distances from a fixed reference plane, there are many different ways to numerically characterize the surface roughness. Two frequently reported quantities are the RMS roughness value, Rq, and the peak-to-valley roughness, Rz, with both reported in dimensions of length.

Conventional ED copper foil made for the circuit industry has had treated side Rz values of 7 to 20 micrometers (um) (corresponding to Rq values of about 1.2 to 4 um) when measured by the WYCO Optical Profiler. Contact profilometers tend to yield lower values, due to the stylus deforming the copper treatment as the measurement is made. The treated side of rolled copper foil exhibits Rz values of 3.5-5.5 um (corresponding to Rq values of 0.45-0.9 um). "Reverse treated" ED foils, such as Oak-Mitsui MLS-TOC-500 can also exhibit Rq values similar to those of rolled foils. The lower profile ED foils currently exhibit Rz values of 2 to 3 um. By WYCO measurement, the shiny side of rolled foil exhibits an Rz value of about 0.7 um and a corresponding Rq of about 0.1 um.

More recently, other types of low profile electrodeposited foils have been commercially available. These include Oak Mitsui products SQ-VLP, with an Rq value measured by the WYCO of 0.7 um and MQ-VLP with a WYCO Rq value of 0.47 um.

Both rolled and ED foils specially treated for the circuit industry are available from a number of commercial manufacturers. For example, low profile copper foils are commercially available from Oak Mitsui under the trade name "TOC-500" and "TOC-500-LZ." High profile copper foils are commercially available from Circuit Foil under the trade name "TWS."

Suitable dielectric circuit substrates comprise low polarity, low dielectric constant and low loss resins, including those based on thermosetting resins such as 1,2-polybutadiene, polyisoprene, poly(etherimide) (PEI), polybutadiene-polyisoprene copolymers, poly(phenylene ether) resins, and those based on allylated poly(phenylene ether) resins. These materials, while exhibiting the desirable features of low dielectric constant and low loss, also exhibit low copper peel strength. The copper peel strength of such materials can be significantly improved by the use of the instant invention. It is also important that the peel strength remain relatively high at elevated temperatures to allow for "rework," i.e., the removal and replacement of soldered components on the circuit board. Combinations of low polarity resins with higher polarity resins can also be used, examples including epoxy and poly (phenylene ether), epoxy and poly(ether imide), cyanate ester and poly(phenylene ether), and 1,2-polybutadiene and polyethylene. Compositions containing polybutadiene, polyisoprene, and/or butadiene- and isoprene-containing copolymers are especially useful.

Particularly suitable circuit substrates are thermosetting compositions comprising a thermosetting polybutadiene and/or polyisoprene resin. As used herein, the term "thermosetting polybutadiene and/or polyisoprene resin" includes homopolymers and copolymers comprising units derived from butadiene, isoprene, or mixtures thereof. Units derived from other copolymerizable monomers can also be present in the resin, for example in the form of grafts. Exemplary copolymerizable monomers include, but are not limited to, vinylaromatic monomers, for example substituted and unsubstituted monovinylaromatic monomers such as styrene, 3-methylstyrene, 3,5-diethylstyrene, 4-n-propylstyrene, alpha-methylstyrene, alpha-methyl vinyltoluene, para-hydroxystyrene, para-methoxystyrene, alpha-chlorostyrene, alpha-bromostyrene, dichlorostyrene, dibromostyrene, tetrachlorostyrene, and the like; and substituted and unsubstituted divinylaromatic monomers such as divinylbenzene, divinyltoluene, and the like. Combinations comprising at least one of the foregoing copolymerizable monomers can also be used. Exemplary thermosetting polybutadiene and/or polyisoprene resins include, but are not limited to, butadiene homopolymers, isoprene homopolymers, butadiene-vinylaromatic copolymers such as butadiene-styrene, isoprene-vinylaromatic copolymers such as isoprene-styrene copolymers, and the like.

The thermosetting polybutadiene and/or polyisoprene resins can also be modified, for example the resins can be hydroxyl-terminated, methacrylate-terminated, carboxylate-terminated resins. Post-reacted resins can be used, such as such as epoxy-, maleic anhydride-, or urethane-modified butadiene or isoprene resins. The resins can also be crosslinked, for example by divinylaromatic compounds such as divinyl benzene, e.g., a polybutadiene-styrene crosslinked with divinyl benzene. Suitable resins are broadly classified as "polybutadienes" by their manufacturers, for example Nippon Soda Co., Tokyo, Japan, and Sartomer Company Inc., Exton, Pa. Mixtures of resins can also be used, for example, a mixture of a polybutadiene homopolymer and a poly(butadiene-isoprene) copolymer. Combinations comprising a syndiotactic polybutadiene can also be useful.

The thermosetting polybutadiene and/or polyisoprene resin can be liquid or solid at room temperature. Suitable liquid resins can have a number average molecular weight greater than about 5,000 but generally have a number average molecular weight of less than about 5,000 (most preferably about 1,000 to about 3,000). Thermosetting polybutadiene and/or polyisoprene resins having at least 90 wt % 1, 2 addition are preferred because they exhibit the greatest crosslink density upon cure, due to the large number of pendent vinyl groups available for crosslinking.

The polybutadiene and/or polyisoprene resin is present in the resin system in an amount of up to 100 wt %, specifically about 60 wt % with respect to the total resin system, more specifically about 10 to about 55 wt %, even more specifically about 15 to about 45 wt %, based on the total resin system.

Other polymers that can co-cure with the thermosetting polybutadiene and/or polyisoprene resins can be added for specific property or processing modifications. For example, in order to improve the stability of the dielectric strength and mechanical properties of the electrical substrate material over time, a lower molecular weight ethylene propylene elastomer can be used in the resin systems. An ethylene propylene elastomer as used herein is a copolymer, terpolymer, or other polymer comprising primarily ethylene and propylene. Ethylene propylene elastomers can be further classified as EPM copolymers (i.e., copolymers of ethylene and propylene monomers) or EPDM terpolymers (i.e., terpolymers of ethylene, propylene, and diene monomers). Ethylene propylene diene terpolymer rubbers, in particular, have saturated main chains, with unsaturation available off the main chain for facile cross-linking Liquid ethylene propylene diene terpolymer rubbers, in which the diene is dicyclopentadiene, are preferred.

Useful molecular weights of the ethylene propylene rubbers are less than 10,000 viscosity average molecular weight. Suitable ethylene propylene rubbers include an ethylene propylene rubber having a viscosity average molecular weight (MV) of about 7,200, which is available from Uniroyal Chemical Co., Middlebury, Conn., under the trade name Trilene CP80; a liquid ethylene propylene dicyclopentadiene terpolymer rubbers having a molecular weight of about 7,000, which is available from Uniroyal Chemical Co. under the trade name of Trilene 65; and a liquid ethylene propylene ethylidene norbornene terpolymer, having a molecular weight of about 7,500, which is available from Uniroyal Chemical Co. under the name Trilene 67.

The ethylene propylene rubber is preferably present in an amount effective to maintain the stability of the properties of the substrate material over time, in particular the dielectric strength and mechanical properties. Typically, such amounts are up to about 20 wt % with respect to the total weight of the resin system, more specifically about 4 to about 20 wt %, even more specifically about 6 to about 12 wt %.

Another type of co-curable polymer is an unsaturated polybutadiene- or polyisoprene-containing elastomer. This component can be a random or block copolymer of primarily 1,3-addition butadiene or isoprene with an ethylenically unsaturated monomer, for example a vinylaromatic compound such as styrene or alpha-methyl styrene, an acrylate or methacrylate such a methyl methacrylate, or acrylonitrile. The elastomer is preferably a solid, thermoplastic elastomer comprising a linear or graft-type block copolymer having a polybutadiene or polyisoprene block, and a thermoplastic block that preferably is derived from a monovinylaromatic monomer such as styrene or alpha-methyl styrene. Suitable block copolymers of this type include styrene-butadiene-styrene triblock copolymers, for example those available from Dexco Polymers, Houston, Tex., under the trade name Vector 8508M, from Enichem Elastomers America, Houston, Tex., under the trade name Sol-T-6302, and those from Fina Oil and Chemical Company, Dallas, Tex., under the trade name Finaprene 401; styrene-butadiene diblock copolymers; and mixed triblock and diblock copolymers containing styrene and butadiene, for example those available from Shell Chemical Corporation, Houston, Tex., under the trade name Kraton D1118. Kraton D1118 is a mixed diblock/triblock styrene and butadiene containing copolymer, containing 30 volume % styrene.

The optional polybutadiene- or polyisoprene-containing elastomer can further comprise a second block copolymer similar to that described above, except that the polybutadiene or polyisoprene block is hydrogenated, thereby forming a polyethylene block (in the case of polybutadiene) or an ethylene-propylene copolymer block (in the case of polyisoprene). When used in conjunction with the above-described copolymer, materials with greater toughness can be produced. An exemplary second block copolymer of this type is Kraton GX1855 (commercially available from Shell Chemical Corp.), which is believed to be a mixture of a styrene-high 1,2-butadiene-styrene block copolymer and a styrene-(ethylene-propylene)-styrene block copolymer.

Typically, the unsaturated polybutadiene- or polyisoprene-containing elastomer component is present in the resin system in an amount of about 10 to about 60 wt % with respect to the total resin system, more specifically about 20 to about 50 wt %, or even more specifically about 25 to about 40 wt %.

Still other co-curable polymers that can be added for specific property or processing modifications include, but are not limited to, homopolymers or copolymers of ethylene such as polyethylene and ethylene oxide copolymers; natural rubber; norbornene polymers such as polydicyclopentadiene; hydrogenated styrene-isoprene-styrene copolymers and butadiene-acrylonitrile copolymers; unsaturated polyesters; and the like. Levels of these copolymers are generally less than 50 vol. % of the total resin system.

Free radical-curable monomers can also be added for specific property or processing modifications, for example to increase the crosslink density of the resin system after cure. Exemplary monomers that can be suitable crosslinking agents include, for example, di, tri-, or higher ethylenically unsaturated monomers such as divinyl benzene, triallyl cyanurate, diallyl phthalate, and multifunctional acrylate monomers (e.g., Sartomer resins available from Arco Specialty Chemicals Co., Newtown Square, Pa.), or combinations thereof, all of which are commercially available. The crosslinking agent, when used, is present in the resin system in an amount of up to about 20 vol. %, specifically 1 to 15 vol. %, based on the total weight of the resin.

A curing agent can be added to the resin system to accelerate the curing reaction of the polyenes having olefinic reactive sites. Specifically useful curing agents are organic peroxides such as, dicumyl peroxide, t-butyl perbenzoate, 2,5-dimethyl-2,5-di(t-butyl peroxy)hexane, $\alpha,\alpha$-di-bis(t-butyl peroxy)diisopropylbenzene, and 2,5-dimethyl-2,5-di(t-butyl peroxy)hexyne-3, all of which are commercially available. They can be used alone or in combination. Typical amounts of curing agent are from about 1.5 to about 10 wt % of the total resin composition.

The circuit substrate materials can optionally include particulate fillers. Examples of suitable fillers include titanium dioxide (rutile and anatase), barium titanate, strontium titanate, silica (particles and hollow spheres) including fused amorphous silica; corundum, wollastonite, aramide fibers (e.g., Kevlar), fiberglass, $Ba_2Ti_9O_{20}$, glass spheres, quartz, boron nitride, aluminum nitride, silicon carbide, beryllia, alumina, magnesia, mica, talcs, nanoclays, aluminosilicates (natural and synthetic), and magnesium hydroxide. Combinations of fillers can also be used. More specifically, rutile titanium dioxide and amorphous silica are especially desirable because these fillers have a high and low dielectric constant, respectively, thereby permitting a broad range of dielectric constants combined with a low dissipation factor to be achieved in the final cured product by adjusting the respective amounts of the two fillers in the composition. These fillers can be used alone or in combination.

The circuit substrate can optionally further include woven, thermally stable webs of a suitable fiber, specifically glass (E, S, and D glass) or high temperature polyester fibers (e.g., KODEL from Eastman Kodak). Such thermally stable fiber reinforcement provides a circuit laminate with a means of controlling shrinkage upon cure within the plane of the laminate. In addition, the use of the woven web reinforcement renders a circuit substrate with a relatively high mechanical strength.

Examples of the woven fiberglass web are set forth in the following Table 1.

TABLE 1

| Manufacturer | Style | Thickness, in. (um) |
|---|---|---|
| Fiber Glast | 519-A | 0.0015 (38.1) |
| Clark-Schwebel | 112 | 0.0032 (81.3) |

TABLE 1-continued

| Manufacturer | Style | Thickness, in. (um) |
|---|---|---|
| Clark-Schwebel | 1080 | 0.0025 (63.5) |
| Burlington | 106 | 0.0015 (38.1) |
| Burlington | 7628 | 0.0068 (172.7) |

The circuit substrates can optionally include fire retardant additives, such as bromine containing flame retardants. Suitable brominated flame retardants are commercially available from, for examples Albemarle Corporation under the trade names SAYTEX BT 93W (ethylene bistetrabromophthalimide), SAYTEX 120 (tetradecabromodiphenoxybenzene), and SAYTEX 102E (decabromodiphenoxyl oxide).

In practice, the adhesive composition can be directly applied to a conductive layer or a dielectric substrate layer as a coating (if of sufficiently low viscosity), or dissolved or suspended, i.e., in the form of a solution. Where a solution is used, the adhesive composition is dissolved in a suitable solvent before application. The solvent is chosen so as to dissolve the adhesive composition and to have a convenient evaporation rate for applying and drying the coating. A non-exclusive list of possible solvents is xylene, toluene, methyl ethyl ketone, methyl isobutyl ketone, hexane, and higher liquid linear alkanes, such as heptane, octane, nonane, and the like, cyclohexane, isophorone, and various terpene-based solvents. Specifically, suitable solvents include xylene, toluene, methyl ethyl ketone, methyl isobutyl ketone, and hexane, and more specifically xylene and toluene. The concentration of the adhesive composition in solution is not critical and will depend on the solubility of the adhesive components, the method of application, and other factors. In general, the solution comprises 1 to about 50 wt %, more specifically about 5 to about 20 wt % of the adhesive composition, based on the total weight of the adhesive solution.

The adhesive or adhesive solution can be applied to a surface of a conductive layer or a dielectric circuit substrate material (e.g., a prepreg or a B-staged material) by known methods in the art, for example by dip, spray, wash, or other suitable coating technique. If the adhesive solution exhibits phase separation during coating or drying, the uniformity may be improved by increasing the solution temperature. Where a solvent is present, the adhesive solution is allowed to dry under ambient conditions, or by forced or heated air, to form an adhesion promoting layer. Typically, the adhesion promoting layer is applied to provide a coating weight of about 2 grams per square meter ($g/m^2$ or "gsm") to about 15 $g/m^2$, specifically about 3 $g/m^2$ to about 8 $g/m^2$. The adhesion promoting layer can be uncured or partially cured in the drying process, or the adhesion promoting layer can be partially or fully cured, if desired, after drying.

After application of the adhesive coating, the coated conductive layer or coated circuit substrate can be stored or used directly to form a circuit laminate. The laminate can be formed by means known in the art. In one embodiment, the lamination process entails placing one or more layers of coated or uncoated circuit substrate between one or two sheets of coated or uncoated conductive layers (provided that an adhesive layer is disposed between at least one conductive layer and at least one dielectric substrate layer). The layered material can then be stored prior to lamination and cure, partially cured and then stored, or laminated and cured after stacking. Lamination and curing can be by a one-step process, for example using a vacuum press, or by a multiple-step process. In an exemplary multiple-step process, a conventional peroxide cure step at temperatures of about 150° C. to about 200° C. is conducted, and the partially cured stack can then be subjected to a high-energy electron beam irradiation cure (E-beam cure) or a high temperature cure step under an inert atmosphere. Use of a two-stage cure can impart an unusually high degree of cross-linking to the resulting laminate. The temperature used in the second stage is typically about 250° C. to about 400° C., or the decomposition temperature of the resin. This high temperature cure can be carried out in an oven but can also be performed in a press, namely as a continuation of the initial lamination and cure step. Particular lamination temperatures and pressures will depend upon the particular adhesive composition and the substrate composition, and are readily ascertainable by one of ordinary skill in the art without undue experimentation.

In accordance with various specific embodiments, FIG. 1 shows an exemplary circuit material 10 comprising adhesive layer 14 disposed on a conductive layer, e.g., a copper foil 12. As used herein, "disposed" means at least partial intimate contact between conductive layer copper foil and the adhesive. It is to be understood that in all of the embodiments described herein, the various layers can fully or partially cover each other, and additional copper foil layers, patterned circuit layers, and dielectric layers can also be present. Adhesive layer 14 can be uncured or partially cured.

Figure 2:
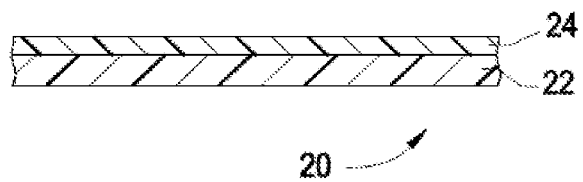
FIG. 2 shows an exemplary circuit material with an adhesive layer disposed on a dielectric substrate layer.

FIG. 2 shows an exemplary circuit material 20 comprising an adhesive layer 24 disposed on a dielectric circuit substrate 22. Adhesive layer 24 can be uncured or partially cured, and substrate 22 can be uncured, partially cured, or fully cured.

Figure 3:
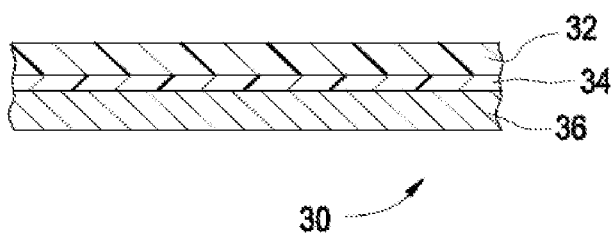
FIG. 3 shows an exemplary circuit laminate comprising an adhesive layer.

FIG. 3 shows an exemplary circuit laminate 30 comprising an adhesive layer 34 disposed between a dielectric circuit substrate 32 and a conductive layer 36, e.g., a copper foil. Adhesive layer 34 can be uncured or partially cured, and substrate 32 can be uncured, partially cured, or fully cured.

Figure 4:
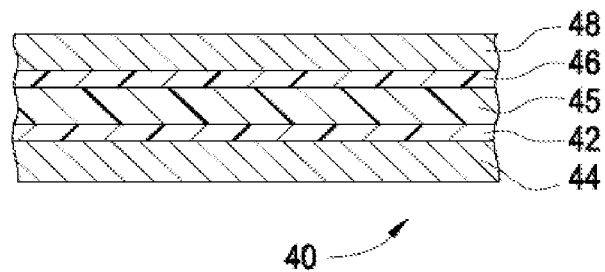
FIG. 4 shows an exemplary double clad circuit laminate comprising two adhesive layers.

FIG. 4 shows an exemplary double clad circuit laminate 40 comprising a first adhesive layer 42 disposed between a first conductive layer 44 and a first side of a dielectric circuit substrate 45. Second adhesive layer 46 is disposed between second conductive layer 48 and a second side of circuit substrate 45. The first and second adhesive layers 42, 46 can comprise the same or different polymer composition, and first and second conductive layers 44, 48 can comprise the same or different types of conductive layer, e.g. copper foil. It is also possible to use only one of the adhesive layers 42, 46, or to substitute one of adhesive layers 42, 43 with a bond ply as is known in the art (not shown).

Figure 5:
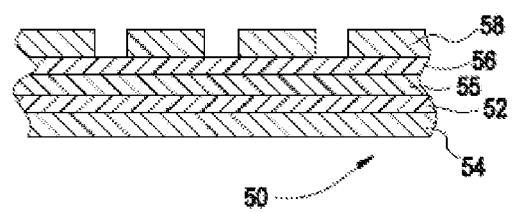
FIG. 5 shows an exemplary double clad circuit comprising two adhesive layers.

FIG. 5 shows an exemplary double clad circuit 50 comprising a first adhesive layer 52 disposed between a first conductive layer 54 and a first side of a dielectric circuit substrate 55. Second adhesive layer 56 is disposed between a patterned (e.g., etched) circuit layer 58 and a second side of dielectric circuit substrate 55. The first and second adhesive layers 52, 56 can comprise the same or different polymer composition. It is also possible to use only one of the adhesive layers 52, 56, or to substitute one of adhesion layers 52, 56 with a bond ply as is known in the art (not shown).

Figure 6:
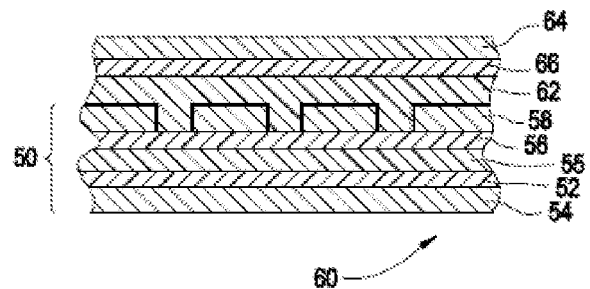
FIG. 6 shows an exemplary multi-layer circuit comprising three adhesive layers.

FIG. 6 shows an exemplary circuit 60 comprising the circuit material 50 as described in FIG. 5. A bond ply 62 can be disposed on the side of the patterned circuit 58 opposite adhesive layer 56, and resin-coated conductive layer comprising a copper foil 64 disposed on bond ply 62 is disposed on a side opposite patterned circuit 58. Optionally, and as shown in FIG. 6, a third adhesive layer 66 is disposed between bond ply 62 and copper foil 64. The first, second, and third adhesive layers 52, 56, 62, can comprise the same or different polymer composition, and first and second conductive layers 54, 64 can comprise the same or different types of, e.g., copper foil.

The above-described compositions and methods provide a circuit laminate with excellent properties. In one embodiment, the circuit laminate has a dielectric constant of less than about 3.8 measured at 10 gigahertz. In another embodiment, the resultant circuit laminate has a dissipation factor of less than about 0.007 measured at 10 gigahertz. In yet another embodiment, the circuit laminate has a dielectric constant of less than about 3.8 and a dissipation factor of less than about 0.007 measured at 10 gigahertz. Specifically, the dielectric constant and dissipation factor of the circuit material are within about 25%, and more specifically within about 10% of the corresponding values for the circuit material without the adhesive composition. In addition, it is further desirable that other physical properties such as dielectric breakdown strength and water absorption are similar to and/or compatible with the electrical characteristics of the circuit material, specifically within about 25%, and more specifically within about 10% of the corresponding values for the circuit material without the adhesive composition.

In addition, the circuit laminate has improved bond strength. In a particularly advantageous feature, the improved bond strength is retained at elevated temperatures. This improvement is obtained while maintaining (i.e., not significantly adversely affecting) the dielectric properties of the dielectric circuit substrate material alone. Use of an adhesive as described above typically results an increased peel strength of about 1.0, specifically about 1.5 pound per linear inch ("pli") on ½-ounce/ft² copper, over the peel strength without the adhesive. In a specific embodiment, the circuit laminate further retains bond after repeated solder exposures, does not blister after solder immersion, and maintains bond strength at elevated temperatures (up to 288° C.).

The invention is further illustrated by the following non-limiting Examples.

EXAMPLES

The materials listed in Table 2 were used in the following examples.

Copper peel strength was tested in accordance with the "Peel strength of metallic clad laminates" test method (IPC-TM-650 2.4.8).

The laminates were tested for solder float by floating them on a pot of molten solder at a temperature of 288° C. for 10 seconds. This procedure is repeated five times on each sample. A failure in the solder float test is noted if there is blistering or delamination of the copper foil from the laminate surface.

Examples 1-4 and Comparative Examples A-D

Circuit laminates were prepared using an adhesive composition as set forth in Table 3 disposed between a dielectric circuit substrate and a copper foil. The adhesive compositions in Examples 1, 1A-4 and A-D contained 100 parts by weight of a maleinized poly(arylene ether) (10 wt % solution in a solvent having 98% toluene and 2% xylene), 0.5 parts by weight of Varox (a peroxide cure initiator), and the indicated amounts of a functionalized polybutadiene polymer and an elastomeric block copolymer.

The adhesive was coated onto ½ oz./ft² TWS copper foil with an RMS surface roughness of greater than 2 um, as measured by the WYCO interferometer, and dried to provide a coating having dry coating basis weight of 5-6 g/m². Prepreg sheets of two different dielectric substrates were laminated to the treated copper foil using a press cycle consisting of a rapid ramp to 345° F. (174° C.) and 15 minute hold at 345° F. (174° C.) and then a ramp to 475° F. (246° C.) and an additional hour hold at 475° F. (246° C.). A pressure of 1000 psi (70.3 kilogram/centimeters²) is maintained throughout the cycle.

The samples were tested for solder float and if they passed, they were subsequently tested for peel strength. Results are shown in Table 3.

TABLE 2

| Material name | Chemical name | Supplier |
| --- | --- | --- |
| PPE-MA | Maleinized polyphenylene ether | Asahi |
| Blendex HPP820 | Unmodified polyphenylene ether | Chemtura |
| Ricon ® 184MA6 | Butadiene-styrene copolymer adducted with maleic anhydride | Sartomer |
| Hycar 2000 X168 | Vinyl-terminated polybutadiene | Noveon |
| TE 2000 | Polybutadiene with urethane linkages | Nippon Soda |
| B3000 | Vinyl-terminated polybutadiene | Nippon Soda |
| BN1015 | Maleinated polybutadiene | Nippon Soda |
| Kraton ® D-1118 | SB diblock copolymer (20%) and SBS triblock copolymer (80%) | Shell Chemical |
| RO-4350B | Flame retardant thermosetting hydrocarbon-based circuit substrate material | Rogers Corp. |
| RO-4233 | Thermosetting hydrocarbon-based circuit substrate material | Rogers Corp. |
| FR | Flame retardant nonpolar circuit substrate material containing $Mg(OH)_2$ (U.S. Pat. No. 7,022,404 to Sethumadhavan et al.) | |
| TOC-500 | Low profile standard copper, zinc free | Oak-Mitsui |
| TOC-500-LZ | Low profile copper, with light zinc flush | Oak-Mitsui |
| TWS | High profile copper foil | Circuit Foil |

TABLE 3

| Component | Ex. 1 | Ex. 1A | Ex. 2 | Ex. 3 | Ex. 4 | Ex. A | Ex. B | Ex. C | Ex. D |
|---|---|---|---|---|---|---|---|---|---|
| PPE-MA solution | 100 | 100 | 100 | 100 | 100 | 100 | 100 | 100 | 100 |
| KRATON D-1118 | 7.5 | 7.5 | 7.5 | 7.5 | 12.0 | 7.5 | 7.5 | 7.5 | — |
| B3000 | — | 7.5 | — | — | — | — | — | — | — |
| RICON 184MA6 | 3.5 | — | 7.5 | 10.0 | 7.5 | — | — | — | — |
| Hycar 2000 X168 | — | — | — | — | — | — | 7.5 | — | — |
| TE 2000 | — | — | — | — | — | — | — | 7.5 | — |
| Solder Float, 288° C. (pass/fail) | Marginal | Marginal | Pass | Pass | Pass | Fail | Fail | Fail | Fail |
| Bond with FR substrate (pli) | NT | NT | 5.3 | 4.0 | 5.6 | NT | NT | NT | NT |
| Bond with RO 4350B (pli) | NT | 4.51 | 5.4 | NT | NT | NT | NT | NT | NT |

NT—not tested.

These examples demonstrate that an adhesive in accordance with the present invention increases copper peel strength of a circuit laminate having a comparatively high profile foil. They also demonstrate the efficacy of the coating in improving adhesion to substrate compositions other than RO4350B high frequency laminate. Furthermore, they demonstrate the importance of the maleinized polybutadiene in improving the high temperature resistance of the adhesive coating.

Comparative Examples A and D show that all three components of the adhesive composition are required to simultaneously increase the copper peel strength and pass the high temperature solder float test. In particular, absence of the elastomeric block copolymer (Ex. D) and/or the carboxylated polybutadiene polymer (Exs. A-D) result in failure in solder float test. Substitution of a vinyl-terminated butadiene polymer (Ex. B) or a urethane-functionalized butadiene polymer (Ex. C) also results in failure in solder float test.

Examples 1-4 show that lower amounts of carboxylated butadiene polymer (Ex. 1) result in only marginal solder behavior, but that as the content of carboxylated butadiene polymer is increased, both satisfactory solder behavior and improved bonding were obtained (Exs. 2 and 4). Further increase in the carboxylated butadiene polymer (7.5 parts in Ex. 2 to 10.0 parts in Ex. 3) resulted in a slight decrease in copper peel strength (5.3 pli in Ex. 2 vs. 4.0 pli in Ex. 3). These examples demonstrate the utility of this coating to materials other than RO4350B circuit substrate.

Examples 2-4 were laminated to a halogen-free flame retardant Mg(OH)$_2$-filled material described in U.S. Pat. No. 7,022,404 to Sethumadhavan et al. Examples 2-4 demonstrate the utility of this coating with materials other than RO4350B circuit substrate. As a comparison, absence of any adhesive yields a bond strength of only 1.9 pli with the halogen-free system and about 3.5 pli with RO4350B circuit substrate.

The adhesive composition of Example 2 was also coated on two types of comparatively low profile electrodeposited copper foil (Oak Mitsui SQ-VLP and TQ-VLP) and laminated to an RO4350B prepreg as described above. As shown in the table below, the bond of both types of foil was substantially increased by the use of the coating. Both samples also passed the 288° C. solder float testing.

| Copper foil Type | Peel strength (no adhesive) | Peel strength with Adhesive |
|---|---|---|
| SQ-VLP | 2.2 pli | 4.5 pli |
| TQ-VLP | 2.3 pli | 4.2 pli |

This example demonstrates that the coating is effective at improving the bond to a wide variety of copper foils.

Examples 5-6 and Comparative Example E

In Examples 5 and 6, an adhesive solution was formed using 10 parts by weight of a solution of a maleinized poly (arylene ether) (10 wt % in a solution of 98% toluene and 2% xylene), a maleinated polybutadiene (7.5 parts by weight), and an elastomeric block copolymer 7.5 parts by weight). The adhesive solution was used to form a laminate prepared with an RO4350B prepreg (6 layers) and a low profile 0.5 oz copper foil (MLS TOC-500 LZ). The copper foil side having the low zinc treatment was placed in contact with the adhesive layer.

The materials were all laminated in a vacuum press using a rapid ramp to 345° F. (174° C.) and 15 minute hold at 345° F. (174° C.), followed by a ramp to 475° F. (246° C.) and an additional hour hold at 475° F. (246° C.). A pressure of 1000 psi (70.3 kilogram/centimeters$^2$) was maintained throughout the cycle.

The samples were tested for bond strength, solder float, dielectric constant, and dissipation factor. Results are shown in Table 4.

TABLE 4

| Property | Ex. 5 | Ex. 6 | Ex. E |
|---|---|---|---|
| Bond (⅛-inch) (pli) | 5.3 | 4.7 | 3.0 |
| Solder Float | Pass | Pass | Pass |
| Dielectric Constant at 10 Ghz | 3.51 | 3.53 | 3.53 |
| Dissipation Factor at 10 Ghz | 0.0040 | 0.0042 | 0.0042 |

The results in Table 4 show that the copper peel strengths achieved with the adhesive on zinc-coated, low profile copper foils (Exs. 5 and 6) were more than 50% higher than the value without the adhesive (Ex. E). Moreover, results from Examples 5, 6, and E indicate that use of adhesive coating did not negatively impact the high temperature solderability, dielectric constant, or dissipation factor of the laminates.

Examples 8-10 and Comparative Example G

In Examples 8-10, an adhesive solution comprising 10 parts by weight of a maleinized poly(arylene ether) (10 wt % in a solution of 98% toluene and 2% xylene), 7.5 parts by weight of a maleinated polybutadiene, and 7.5 parts by weight of an elastomeric block copolymer was used as an adhesive for a laminate prepared with an RO4233 prepreg (3 layers) and a 0.4 um RMS low profile copper foil (MLS TOC-500-

LZ, 0.5 oz). The copper foil side having the zinc treatment was placed in contact with the adhesive layer. Different coating thicknesses were used for Examples 8-10 (amounts shown are on a dry weight basis). In Comparative Example G, no adhesive formulation was used.

The samples were laminated as described above. Test results are shown in Table 5.

TABLE 5

| Components | Ex. 8 | Ex. 9 | Ex. 10 | Ex. G |
|---|---|---|---|---|
| Coating Thickness (gsm) | 3.0 | 5.0 | 10.0 | (No Coating) |
| Bond (pli) | 4.25 | 4.10 | 4.00 | 2.60 |
| Solder Float | Pass | Pass | Pass | Pass |

Examples 8-10 show that the improvement in copper peel strength is seen over a wide range of coating weights (from 3.0 gsm (Ex. 8) to 5.0 gsm (Ex. 9) and 10.0 gsm (Ex. 10)). The wide range of coating weight did not adversely affect the high temperature solder resistance.

The adhesion of the copper foil of Example 9 and Comparative Example G was further tested by measuring the copper pull strength. The pull strength was measured on 0.090-inch (0.2286-centimeter) diameter pads, by soldering a copper wire to the pad and pulling the wire perpendicular to the surface of the laminate with a tensile testing machine. The pull strength is calculated by dividing the maximum recorded force by the area of the pad. The results for four individual pulls of each material, reported in units of psi, are shown in Table 6.

TABLE 6

| | Replicate 1 | Replicate 2 | Replicate 3 | Replicate 4 |
|---|---|---|---|---|
| Example 9 | 8.49 | 10.58 | 9.10 | 7.54 |
| Example G | 5.72 | 5.79 | 7.75 | 6.40 |

The data show that pull strengths in laminates using the inventive adhesive are much higher than those without the adhesive. These results suggest that adhesive coatings improved pull strengths of the coated samples as compared to non-coated materials.

Examples 11-16 and Comparative Examples H-Q

The following examples demonstrate that the adhesive composition is useful for increasing the copper peel strength with a low profile foil. They also demonstrate the efficacy of the coating in improving adhesion to polybutadiene and/or polyisoprene dielectric substrates.

Accordingly, circuit laminates were prepared using an adhesive composition disposed between a circuit substrate and a copper foil. The adhesive compositions are described in Table 7 below. The adhesive compositions in Examples 11-15 and Comparative Examples J-L comprised 100 parts by weight of maleinized poly(arylene ether) (10 wt % solution in 98% toluene and 2% xylene), 0.5 parts by weight of Varox (a peroxide cure initiator), and the indicated amounts of a functionalized polybutadiene polymer and an elastomeric block copolymer. In Example 16, Blendex HPP820, an unmodified poly(arylene ether) commercially available from Chemtura, was substituted for the maleinized poly(arylene ether). In Example N, BN1015, a maleinated polybutadiene polymer commercially available from Nippon Soda, was substituted for the RICON 184MA6.

The adhesive was coated onto ½-oz./ft² MLS TOC-500-LZ copper foil with an RMS surface roughness of about 0.4 um, as measured by the WYCO interferometer at a final target dry basis weight of approximately 5 grams/m² (gsm) using a #28 Mayer rod and allowed to air dry in a hood. In example Q, the copper foil was uncoated.

Six 0.0033-inch (0.00838-centimeter) thick prepreg sheets of the RO4350 circuit substrate were laminated to the indicated dried coated copper samples using the above-described lamination cycle to from a 0.020-inch (0.0508-centimeter) thick laminate. The laminates were tested for solder float. Results are shown in Table 7.

Examples 11-16 show that all of the examples containing a poly(arylene ether) are at least 40% higher in copper peel strength than the uncoated control, Example Q. This improvement in relatively smooth copper adhesion alone is a significant improvement in the utility of these circuit substrates. Comparative examples H, I, M, and N demonstrate that the presence of the maleinized poly(arylene ether) also provides an increase in peel strength. In none of these four cases, which contain the other components of the coating formulation but do not contain a maleinized poly(arylene ether) polymer, does the copper peel strength exceed 3.5 pli.

Comparative examples J and K demonstrate that presence of the maleinated polybutadiene further improves the utility of the coating by improving the high temperature solder resistance of the finished laminate. It can be seen from table 7 that all examples containing the maleinized or non-maleinized poly(arylene ether) that also contain the maleinated polybutadiene exhibit both the increase in copper peel strength and pass the 288° C. solder float test. Without being bound by theory, it is believed that the increased polarity of the maleinated polybutadiene polymer helps improve the high temperature bond of the copper foil to the laminate by interacting more strongly with the polar surface of the foil.

Comparative example L demonstrates the utility of the styrene-butadiene block copolymer in providing a smooth and uniform coating when both types of poly(arylene ether) and the maleinated polybutadiene are present. In example L, in which the Kraton 1118 was omitted, the coating was noted to be "grainy" or non-uniform on a macroscopic size scale. It is hypothesized that the styrene-butadiene copolymer acts to compatibilize, at least on a macroscopic scale, the poly (arylene ether) polymer and maleinated polybutadiene polymers.

TABLE 7

| Component | 11 | 12 | 13 | 14 | 15 | 16 | H | I | J | K | L | M | N | P | Q |
|---|---|---|---|---|---|---|---|---|---|---|---|---|---|---|---|
| PPE-MA solution | 100 | 100 | 100 | 100 | 100 | — | — | — | 100 | 100 | 100 | — | — | — | — |
| KRATON D-1118 | 7.5 | 7.5 | 7.5 | 12.0 | 3.75 | 7.5 | 7.5 | — | — | 7.5 | — | 7.5 | — | 7.5 | — |
| RICON 184MA6 | 3.5 | 7.5 | 10.0 | 7.5 | 7.5 | 7.5 | — | 7.5 | — | — | 7.5 | 7.5 | — | — | — |

TABLE 7-continued

| Component | 11 | 12 | 13 | 14 | 15 | 16 | H | I | J | K | L | M | N | P | Q |
|---|---|---|---|---|---|---|---|---|---|---|---|---|---|---|---|
| Blendex HPP820 | — | — | — | — | — | 100 | — | — | — | — | — | — | — | — | — |
| BN1015 | — | — | — | — | — | — | — | — | — | — | — | — | 7.5 | — | — |
| Coating Appearance | Good | Good | Good | Good | Good | Good | Tacky | Tacky | Good | Good | Grainy | Tacky | Tacky | Tacky | — |
| Solder Float, 288° C. (pass/fail) | Pass | Pass | Pass | Pass | Pass | Pass | Pass | Pass | Fail | Fail | Pass | Pass | Pass | Pass | Pass |
| Copper Peel Strength (pli) | 4.70 | 4.75 | 4.67 | 4.26 | 4.60 | 4.60 | 3.2 | 2.85 | 5.2 | — | 4.88 | 3.45 | 2.70 | 2.75 | 3.0 |

Examples 17-23

These Examples demonstrate the suitability of these adhesive formulations for effective and economical coating on standard production equipment, as well as the wide range of formulations over which the copper peel strength and high temperature resistance are improved.

Commercial scale coating trials of 25-inch (63.5-centimeter) wide rolls of copper foil were conducted on a slot die coater using the formulations shown in Table 8 (amounts shown are in grams). The six formulations we coated at line speeds of 30 feet/minute (fpm) (9.14 meter/minute) onto both Gould TWS high profile copper foil and Oak Mitsui MLS-TOC-500-LZ reverse-treated (low profile) copper foil (Ex. 17-Ex. 22). Formulation 20 was also coated at 60 fpm, simply to demonstrate that higher speed coating was possible (Ex. 23). The coating basis weights ranged from 6 to 8 gsm. The samples were dried in a three-zone in-line oven with drying temperatures of 100° C., 125° C., and 150° C. Approximately 250 linear feet (76.2 linear meters) of useable material was coated for each formulation and copper foil type.

Each sample of coated copper foil was laminated to six sheets of 0.003-inch (0.0076-centimeter) RO4350B prepreg to form a 0.020 inches (0.0508 centimeters) thick laminate using the above press cycle, and tested.

The data for room temperature peel strength, hot oil peel strength, and solder float testing are reported in Table 8.

TABLE 8

| Component | Ex. 17 | Ex. 18 | Ex. 19 | Ex. 20 | Ex. 21 | Ex. 22 | Ex. 23 |
|---|---|---|---|---|---|---|---|
| Toluene | 12540 | 12540 | 12000 | 12000 | 11500 | 12000 | 12000 |
| Xylene | 577 | 577 | 577 | 577 | 525 | 577 | 577 |
| Blendex | 1039 | — | 1039 | 1039 | — | — | 1039 |
| PPE (Asahi) | — | 1039 | — | — | 945 | 1039 | — |
| Kraton | 808 | 808 | 404 | 808 | 735 | 404 | 808 |
| Ricon 184 MA6 | 1617 | 1617 | 1617 | 2079 | 1890 | 1617 | 2079 |
| Varox + Toluene | 52 + 100 | 52 + 100 | 50 + 100 | 52 + 100 | 52 + 100 | 50 + 100 | 52 + 100 |
| Results with MLS-TOC-500-LZ Copper Foil | | | | | | | |
| Copper Peel (pli) | 6.3 | 6.0 | 7.2 | 5.9 | 4.9 | 5.1 | 5.2 |
| Hot Oil Peel, 150° C. (pli) | 3.2 | 3.2 | 3.4 | 3.4 | — | — | 3.2 |
| Hot Oil Peel, 200° C. (pli) | 2.1 | 2.0 | 2.2 | 2.0 | — | — | 2.0 |
| Solder Float, 288° C., 10 s × 5 (pass/fail) | Pass | Pass | Pass | Pass | Pass | — | Pass |
| Coating Weight, gsm | 7.8 | 7.4 | 8.4 | 8.1 | — | — | 6.0 |
| DK @ 11 GHz | 3.53 | 3.53 | 3.53 | 3.53 | — | — | 3.51 |
| DF @ 11 GHz | 0.0042 | 0.0044 | 0.0043 | 0.0044 | — | — | 0.0041 |
| Z-CTE (ppm/° C.) | 45 | — | — | — | — | — | 43 |
| Results with TWS Copper Foil | | | | | | | |
| Copper Peel (pli) | 6.8 | 7.1 | 6.9 | 5.9 | 6.1 | 6.1 | 6.2 |
| Hot Oil Peel, 150° C. (pli) | 3.8 | 3.8 | 3.9 | 3.6 | — | — | 3.6 |
| Hot Oil Peel, 200° C. (pli) | 2.8 | 2.7 | 3.1 | 2.5 | — | — | 2.4 |
| Solder Float, 288° C., 10 s × 5 (pass/fail) | Pass | Pass | Pass | Pass | Pass | — | Pass |
| Coating Weight (gsm) | 7.5 | 7.7 | 8.1 | 7.8 | 7.4 | — | 6.3 |
| DK @ 11 GHz | 3.50 | 3.49 | 3.48 | 3.47 | — | — | 3.51 |
| DF @ 11 GHz | 0.0045 | 0.0044 | 0.0043 | 0.0043 | — | — | 0.0042 |

Peel strength values for the uncoated TWS copper are about 3.5 pli and the value for the uncoated MLS-TOC-500 copper is less than 2 pli (data not shown). The hot oil peel strength data above demonstrate sufficient bond at high temperature to allow for robust "reworkability." The CTE, dielectric constant and loss tangent data show that the adhesive coating does not have a deleterious effect on these properties.

The singular forms "a," "an," and "the" include plural referents unless the context clearly dictates otherwise. The endpoints of all ranges directed to the same characteristic or component are independently combinable and inclusive of the recited endpoint. All references are incorporated herein by reference. As used herein and throughout, "disposed," "contacted," and variants thereof refers to the complete or partial physical contact between the respective materials, substrates, layers, films, and the like. Further, the terms "first," "second," and the like herein do not denote any order, quantity, or importance, but rather are used to distinguish one element from another.

While specific embodiments have been shown and described, various modifications and substitutions can be made thereto without departing from the spirit and scope of the invention. Accordingly, it is to be understood that the present invention has been described by way of illustration and not limitation.

What is claimed is:

1. A circuit laminate, comprising
an adhesion-improving adhesive layer disposed between a conductive copper layer and a dielectric substrate layer without any intervening layers, wherein the composition of the adhesive layer comprises
a poly(arylene ether);
a polybutadiene or polyisoprene polymer comprising butadiene, isoprene, or butadiene and isoprene units, and zero to less than 50 weight percent of co-curable monomer units; and
an elastomeric block copolymer comprising units derived from an alkenyl aromatic compound and a conjugated diene;
wherein the adhesive layer is present in an amount of about 2 to about 15 grams per square meter.

2. The circuit laminate of claim 1, wherein the polybutadiene or polyisoprene polymer is obtained by co-curing the butadiene, isoprene, or butadiene and isoprene units with styrene and/or alpha-methylstyrene units.

3. The circuit laminate of claim 1, wherein the polybutadiene or polyisoprene polymer is not an elastomeric block copolymer.

4. The circuit material of claim 1, wherein the poly(arylene ether) is carboxy-functionalized.

5. The circuit material of claim 1, wherein the poly(arylene ether) is the reaction product of a poly(arylene ether) and a cyclic anhydride.

6. The circuit material of claim 1, wherein the poly(arylene ether) is the reaction product of a poly(arylene ether) and maleic anhydride.

7. The circuit material of claim 1, wherein the polybutadiene or polyisoprene polymer is carboxy-functionalized.

8. The circuit material of claim 7, wherein the carboxy-functionalized polybutadiene or polyisoprene polymer is the reaction product of a polybutadiene or polyisoprene polymer and a cyclic anhydride.

9. The circuit material of claim 8, wherein the carboxy-functionalized polybutadiene or polyisoprene polymer is a maleinized polybutadiene-styrene or maleinized polyisoprene-styrene copolymer.

10. The circuit material of claim 1, wherein the composition of the adhesive layer comprises about 20 to about 99 wt. % of the poly(arylene ether) and about 1 to about 80 wt. % of the polybutadiene or polyisoprene polymer, each based on the combined weight of the poly(arylene ether) and the polybutadiene or polyisoprene polymer.

11. The circuit material of claim 1, wherein, in the elastomeric block copolymer, the alkenyl aromatic compound is styrene and the conjugated diene is polybutadiene.

12. The circuit material of claim 11, wherein the elastomeric block copolymer is styrene-butadiene diblock copolymer, styrene-butadiene-styrene triblock copolymer, styrene-isoprene diblock copolymer, styrene-isoprene-styrene triblock copolymer, styrene-(ethylene-butylene)-styrene triblock copolymer, styrene-(ethylene-propylene)-styrene triblock copolymer, styrene-(ethylene-butylene) diblock copolymer, or a combination comprising at least one of the foregoing copolymers.

13. The circuit material of claim 12, wherein the block copolymer is a styrene-butadiene diblock copolymer, styrene-butadiene-styrene triblock copolymer, or a combination comprising at least one of the foregoing copolymers.

14. The circuit material of claim 13, wherein the block copolymer is a combination of styrene-butadiene diblock copolymer and styrene-butadiene-styrene triblock copolymer.

15. The circuit material of claim 1, wherein the composition of the adhesive layer comprises about 20 to about 98 wt. % of the poly(arylene ether), about 1 to about 79 wt. % of the polybutadiene or polyisoprene polymer, and about 1 to about 79 wt. % of the elastomeric block copolymer, each based on the combined weight of the poly(arylene ether), the polybutadiene or polyisoprene polymer, and the elastomeric block copolymer.

16. The circuit material of claim 1, wherein the adhesive layer is present in an amount of about 3 to about 8 grams per square meter.

17. The circuit material of claim 1, wherein the conductive copper layer is a copper foil having an RMS roughness of less than 0.7 micrometers.

18. The circuit laminate of claim 1, wherein the dielectric substrate layer and the adhesive layer have a dielectric constant of less than about 3.8 and a dissipation factor of less than about 0.007, each measured at frequencies from 1 to 10 gigahertz.

19. The circuit laminate of claim 1, further comprising a second adhesive layer disposed between a second copper conductive layer and a second side of the dielectric substrate layer opposite to side of the dielectric substrate layer on which the first said adhesive layer is disposed.

20. A multi-layer circuit comprising the circuit material of claim 1.

21. The circuit material of claim 1, wherein the composition of the adhesive layer comprises 20 to about 70 wt. % of the polybutadiene or polyisoprene polymer based on the total weight of the polymer portion of the composition.

22. The circuit material of claim 1, wherein filler, if present in the adhesive layer, is in an amount of about 0.1 to 8 weight percent.

23. The circuit material of claim 1, wherein the presence of the adhesive layer increases the peel strength of the conductive copper layer in the circuit material and the adhesive layer fully covers the dielectric substrate layer.

24. A circuit material, comprising
a conductive copper layer and a dielectric substrate layer; and
an adhesion-improving adhesive layer disposed between the conductive copper layer and the dielectric substrate layer without any intervening layers, wherein the composition of the adhesive layer comprises
a poly(arylene ether); and
a polybutadiene or polyisoprene polymer comprising butadiene, isoprene, or butadiene and isoprene units, and zero to less than 50 weight percent of co-curable monomer units;
an elastomeric block copolymer comprising units derived from an alkenyl aromatic compound and a conjugated diene;
wherein the resin composition of the dielectric substrate layer comprises a low polarity thermosetting resin and wherein the adhesive layer is present in an amount of about 2 to about 15 grams per square meter.

25. The circuit material of claim 24, wherein the adhesive layer fully covers the dielectric substrate layer.

26. The circuit material of claim 24, wherein the resin composition of the dielectric substrate layer consists essentially of low polarity thermosetting resin material.

27. The circuit material of claim 24, wherein the resin composition of the dielectric substrate layer comprises a thermosetting polybutadiene and/or polyisoprene resin homopolymer or copolymer comprising units derived from butadiene, isoprene, or mixtures thereof and optionally copolymerizable monomers comprising vinylaromatic monomers and/or divinylaromatic monomers.

28. A circuit material, comprising
a conductive copper layer and a dielectric substrate layer; and
an adhesion-improving adhesive layer disposed between the conductive copper layer and the dielectric substrate layer without any intervening layers, wherein the composition of the adhesive layer comprises
a poly(arylene ether);
a carboxy-functionalized polybutadiene or polyisoprene polymer comprising butadiene, isoprene, or butadiene and isoprene units, and zero to less than 50 weight percent of co-curable monomer units; and
an elastomeric block copolymer comprising units derived from an alkenyl aromatic compound and a conjugated diene;
wherein the adhesive layer is present in an amount of about 2 to about 15 grams per square meter; and
wherein the dielectric substrate layer comprises a low polarity, low dielectric constant and low loss resin selected from the group consisting of a thermosetting polybutadiene and/or polyisoprene resin homopolymer or copolymer comprising units derived from butadiene, isoprene, or mixtures thereof.

29. The circuit material of claim 28, wherein the thermosetting polybutadiene and/or polyisoprene resin in the dielectric substrate layer is a liquid at room temperature.

30. The circuit material of claim 29, wherein the thermosetting polybutadiene and/or polyisoprene resin is present in the resin system in an amount of 15 to 100 wt. % based on the total resin system.

31. The circuit material of claim 28, wherein the dielectric substrate layer comprises a thermosetting polybutadiene and/or polyisoprene resin homopolymer or copolymer in combination with a co-curable polymer selected from the group consisting of ethylene propylene elastomer, unsaturated polybutadiene- or polyisoprene-containing elastomer, a polybutadiene- or polyisoprene-containing elastomer in which the polybutadiene or polyisoprene block is hydrogenated, a homopolymer or copolymer of ethylene, a natural rubber, a norbornene copolymer, a hydrogenated styrene-isoprene-styrene copolymer, a hydrogenated butadiene-acrylonitrile copolymer, and an unsaturated polyester.

32. The circuit material of claim 31, wherein the dielectric substrate layer further comprises free radical-curable monomers to increase the crosslink density of the resin system after cure.

33. The circuit material of claim 32, wherein the dielectric substrate layer comprises, based on the total resin system:
15 to 100 wt. % thermosetting polybutadiene and/or polyisoprene resin homopolymer or copolymer comprising units derived from butadiene, isoprene, or mixtures thereof;
0 to 20 wt. % of an ethylene propylene elastomer or 10 to 60 wt. % of unsaturated polybutadiene and/or polyisoprene-containing elastomer; and
0 to 20 vol. % of free radical-curable monomer.

34. The circuit material of claim 33, wherein the wherein the dielectric substrate layer comprises, based on the total resin system, of 4 to 20 wt. % of ethylene propylene elastomer or 10 to 60 wt. % of unsaturated polybutadiene and/or polyisoprene-containing elastomer and 1 to 20 vol. % of free radical-curable monomer.

* * * * *